(12) United States Patent
Negishi

(10) Patent No.: US 7,857,673 B2
(45) Date of Patent: Dec. 28, 2010

(54) DISPLAY DEVICE, APPARATUS FOR PRODUCING DISPLAY DEVICE, AND METHOD FOR PRODUCING DISPLAY DEVICE

(75) Inventor: Toshio Negishi, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 0 days.

(21) Appl. No.: 12/544,665

(22) Filed: Aug. 20, 2009

(65) Prior Publication Data

US 2010/0013385 A1    Jan. 21, 2010

Related U.S. Application Data

(63) Continuation of application No. PCT/JP2008/052501, filed on Feb. 15, 2008.

(30) Foreign Application Priority Data

Feb. 21, 2007  (JP) ............... 2007-040866
Feb. 21, 2007  (JP) ............... 2007-040867

(51) Int. Cl.
    *H01J 9/00* (2006.01)
(52) U.S. Cl. .................................. 445/24
(58) Field of Classification Search ......... 445/23–25; 313/504; 118/708; 156/60; 204/298.12; 427/66, 577
    See application file for complete search history.

(56) References Cited

U.S. PATENT DOCUMENTS

2005/0005848 A1 * 1/2005 Yamazaki et al. .......... 118/719
2005/0084214 A1   4/2005 Hayashi et al. ............. 385/40

FOREIGN PATENT DOCUMENTS

| CN | 1591527 A     | 3/2005 |
| JP | 2001-176655 A1 | 6/2001 |
| JP | 2002-93586 A1  | 3/2002 |

(Continued)

OTHER PUBLICATIONS

English translation of Office Action issued on Jun. 1, 2010 corresponding Chinese application No. 200880005565.1.

(Continued)

*Primary Examiner*—Joseph L Williams
*Assistant Examiner*—Brenitra M Lee
(74) *Attorney, Agent, or Firm*—Kratz, Quintos & Hanson, LLP

(57) ABSTRACT

A display device free from a deterioration in luminescence efficiency is provided. In the display device of the present invention, since an inorganic film is formed after concave parts in which luminescence portions are positioned are filled with a filling film, no crack is formed in the inorganic film. Since the inorganic film is made of a material having high gas tightness and heat conductivity (such as, diamond-like carbon or AlN), water and oxygen will hardly penetrate the luminescence portions, and heat of the luminescence portions will be conducted to the inorganic film, so that the luminescence portions do not reach high temperatures. Further, since a gap between first and second panels is filled with a resin film, the atmosphere does not enter from the outside. Because the luminescence portions are free from damage from water, oxygen and heat, the display device of the present invention has a prolonged life.

6 Claims, 3 Drawing Sheets

FOREIGN PATENT DOCUMENTS

| | | | |
|---|---|---|---|
| JP | 2002-324667 | A1 | 11/2002 |
| JP | 2004-119086 | A1 | 4/2004 |
| JP | 2004-327272 | A1 | 11/2004 |
| JP | 2005-123089 | A1 | 5/2005 |
| JP | 2005-209631 | A1 | 8/2005 |
| JP | 2005-251721 | A1 | 9/2005 |
| JP | 2006-286211 | A1 | 10/2006 |
| JP | 2007-128741 | A1 | 5/2007 |

OTHER PUBLICATIONS

International Search Report for International Application No. PCT/JP2008/052501 dated May 8, 2008.

\* cited by examiner ent invention is a Continuation of International Application No. PCT/JP2008/52501 filed Feb. 15, 2008, which claims priority to Japan Patent Document No. 2007-040866, filed on Feb. 21, 2007 and Japan Patent Document No. 2007-040867, filed on Feb. 21, 2007. The entire disclosures of the prior applications are hereby incorporated by reference herein in their entireties.

DISPLAY DEVICE, APPARATUS FOR PRODUCING DISPLAY DEVICE, AND METHOD FOR PRODUCING DISPLAY DEVICE

The present invention is a Continuation of International Application No. PCT/JP2008/52501 filed Feb. 15, 2008, which claims priority to Japan Patent Document No. 2007-040866, filed on Feb. 21, 2007 and Japan Patent Document No. 2007-040867, filed on Feb. 21, 2007. The entire disclosures of the prior applications are hereby incorporated by reference herein in their entireties.

BACKGROUND

The present invention relates to a technical field of a display device.

Conventionally, display devices utilizing organic EL (Electro-Luminescence) have been widely used.

However, when organic materials used in the organic EL is in contact with water or oxygen, the organic materials are, generally, likely to be chemically changed. When water or oxygen enters the interior of the display device from the atmosphere, the organic materials are denatured, causing poor light emission.

Particularly in a display device of a top emission type, in which a light discharged to a panel at a side opposite to the panel of which an organic film is provided is taken out to the outside, there are problems of difficult sealing, deterioration in luminescence efficiency, deterioration in sealing performance with lapse of time, etc. Such problems are described in JPA No. 2001-176655 and JPA No. 2006-286211.

SUMMARY OF THE INVENTION

The present invention, which is used to solve the above-mentioned problems, is aimed at providing a display device which prevents invasion of water or oxygen from the outside while maintaining a prolonged life.

In order to solve the above problems, the present invention is directed to a display device including first and second panels, the first and second panels having surfaces arranged opposite to each other, a protected film, a laminated film having concave parts arranged on the surface of the first panel, and a luminescence portion of which a lower electrode, an organic film and an upper electrode are laminated. The luminescence portion is positioned where the concave part is arranged, the protective film being formed on a surface of the laminated film, and the protective film includes a filling film which fills the concave part and an inorganic film formed on a surface of the filling film in at least at portion where the concave part is arranged, wherein a face of the first panel at which the concave parts are formed is made flatter after the filling film is filled than before the filling film is filled.

The present invention is directed to the display device, wherein the inorganic film is made of either a diamond-like carbon or AlN as a main component.

The present invention is directed to the display device, wherein the protective film further includes a resin film formed on a surface of the inorganic film, and wherein the surface of the second panel and the face of the first panel at which the inorganic film is formed are in close contact with the resin film.

The present invention is directed to the display device, wherein each luminescence portion is positioned at a light-emitting area inside an edge of the first panel, an edge of the filling film is adhered to the surface of the first panel outside the light-emitting area, an edge of the inorganic film is adhered to the surface of the first panel outside the edge of the filling film, and an edge of the resin film is adhered to the surface of the first panel outside the edge of the inorganic film.

The present invention is directed to an apparatus for producing a display device, the apparatus includes first and second film forming chambers, an evacuating system connected to the first and second film forming chambers, respectively, a printing head arranged inside the first film-forming chamber, a filling agent feeding system with a filling agent placed therein and connected to the printing head, a control system connected to the printing head, and an inorganic film forming unit arranged inside the second film forming chamber, wherein the printing head is configured to discharge the filling agent fed from the filling agent feeding system to a position according to positional information in the control system, and the first and second film forming chambers are configured so that an object to be processed can be carried from the interior of the first film forming chamber into the second film forming chamber without being exposed to the atmosphere.

The present invention is directed to the apparatus for producing the display device, wherein the inorganic film forming unit comprises first and second electrodes arranged in the second film forming chamber, a gas feeding system for feeding hydrocarbon gas into the second film forming chamber is connected to the second film forming chamber, and a high frequency voltage is to be applied between the first and second electrodes.

The present invention is directed to the apparatus for producing the display device, wherein the inorganic film forming unit possesses a target of an inorganic material arranged inside the second film forming chamber, and a sputtering gas introduction system for feeding a sputtering gas into the second film forming chamber is connected to the inside of the second film forming chamber.

The present invention is directed to a display device producing method for producing a display device, the display device including first and second panels, the first and second panels having surfaces arranged opposite to each other, a protective film, a laminated film having concave parts and arranged on the surface of the first panel, and luminescence portions of which a lower electrode, an organic film and an upper electrode are laminated and the luminescence portion is positioned where the concave part is arranged, with the protective film being formed on a surface of the laminated film. The display device producing method includes the steps of carrying the first panel on which the laminated film is formed into the first film forming chamber; forming a filling film by impinging a filling agent in the concave part in order to make a face of the first panel on which the concave parts are formed to be flatter than before the filling film is formed in the state that a printing ambience which is at a pressure lower than the atmospheric pressure is formed inside the first film forming chamber; and then, forming an inorganic film on a surface of the filling film so as to form the protective film having the filling film and the inorganic.

The present invention is directed to the display device producing method which further includes the steps of carrying the first panel on which the filling layer is formed into the second film forming chamber; arranging the first panel between first and second electrodes inside the second film forming chamber; applying a voltage between the first and second electrodes in the state that a reactive ambience containing a hydrocarbon gas and having a pressure lower than the atmospheric pressure and equal to or higher than the printing ambience is formed inside the second film forming chamber; and forming the inorganic film including diamond-like carbon on a surface of the filling film.

The present invention is directed to the display device producing method which further includes the steps of carrying the first panel on which the filling film is formed into the second film forming chamber; forming the inorganic film on a surface of the filling film by sputtering a target arranged inside the second film forming chamber in a state such that a sputtering ambience containing a sputtering gas and having a pressure lower than the pressure of the printing ambience is formed inside the second film forming chamber.

The present invention is directed to the display device producing method, wherein a target containing Al is used; and a gas containing nitrogen in its chemical structure is incorporated into the sputtering ambience and the sputtering is performed, thereby forming the inorganic film containing AlN.

The present invention is directed to the display device producing method, wherein the filling agent is impinged in the concave parts by an ink jet method.

The present invention is directed to the display device producing method, wherein the filling film is formed in a state such that the content of each of oxygen and water inside the first film forming chamber is set to 1 ppm or less; and the inorganic film is formed in a state such that the content of each of oxygen and water inside the second film forming chamber is set to 1 ppm or less.

The present invention is directed to the display device producing method which further includes, after a resin film is formed on a surface of the first panel on which the inorganic film is formed, the steps of making a surface of the second panel opposed to a face of the first panel on which the resin film is formed; and bonding the second panel to the first panel by means of a ring-shaped sealing member surrounding the resin film in a state such that the second panel is adhered to the resin film.

The present invention is directed to the display device producing method further includes arranging the first panel on which the inorganic film is formed inside a third film forming chamber, and coating a resin liquid on a surface of the inorganic film in the state that a coating ambience having a pressure equal to or lower than the pressure of the reactive ambience is formed inside the third film forming chamber in order to form the resin film.

The present invention is directed to the display device producing method which further includes, after a resin film is formed on that surface of the first panel on which the inorganic film is formed, the steps of making a surface of the second panel opposed to that face of the first panel on which the resin film is formed; and bonding the second panel to the first panel by a ring-shaped sealing member surrounding the resin film in a state such that second panel is adhered to the resin film.

The present invention is directed to the method for producing the display device which further includes the steps of arranging the first panel on which the inorganic film is formed in the third film forming chamber; and coating a resin liquid on a surface of the inorganic film so as to form the resin film in a state such that a coating ambience having a pressure lower than the atmospheric pressure and higher than the pressure of the sputtering ambience is formed inside the third film forming chamber.

The gap between the first and second panels is filled with the resin film so that water and oxygen will hardly ever enter the interior of the display device. Because each of the luminescence portions is covered with the inorganic film, water or oxygen does not enter the luminescence portions even if they enter the display device. The inorganic film composed mainly of either diamond-like carbon or AlN (aluminum nitride) has high heat conductivity so that the luminescence portions do not reach high temperatures or undergo heat damage. Because both the diamond-like carbon thin film and the AlN thin film have excellent light transparency, a light takeout efficiency does not decrease, even when the present invention is applied to the top emission type display device.

DETAILED DESCRIPTION OF THE INVENTION

Figure 1:
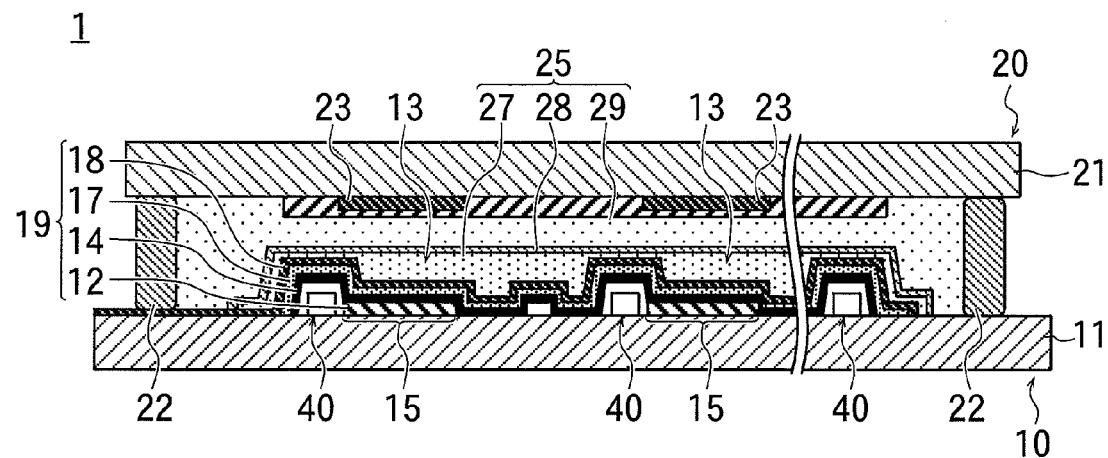
FIG. 1 is a sectional view for illustrating an embodiment of a display device of the present invention.

In FIG. 1, reference numeral 1 generally denotes one embodiment of the display device of the present invention.

This display device 1 includes first and second panels 10, 20, and the first and second panels 10, 20 are bonded to each other by means of a ring-shaped sealing member 22 in a state such that surfaces of the first and second panels 10, 20 are opposed to each other.

The first panel 10 includes a first substrate 11. A plurality of pixel electrodes (lower electrodes) 12 are arranged in a matrix shape on the surface of the first substrate 11 inside the sealing member 22. In this embodiment, an organic film 14, an injection layer 17 and a transparent electrode film (upper electrode) 18 are laminated to cover each pixel electrode 12; and thereby, a laminated film 19 having the pixel electrode 12, the organic film 14, the injection layer 17 and the transparent electrode film 18 is formed.

Here, the transparent electrode film 18 is formed in order to cover each pixel electrode 12; and at least a part of the transparent electrode film 18 is extended to the outside of the ring of the sealing member 22 and connected to a land (not shown) arranged on the surface of the first panel 10. The land is configured to be connectable to a terminal of an external circuit, and a voltage is applied to the transparent electrode film 18 from the external circuit via the land.

The pixel electrodes 12 are respectively connected to, for example, the below-mentioned transistor 40 (for example, a TFT or a thin film transistor). The pixel electrode 12 is selected, the transistor 40 connected to this pixel electrode 12 is electrically conducted, and when a voltage is applied between the pixel electrode 12 and the transparent electrode film 18, light is emitted at a portion of the organic film 14 located above this pixel electrode 12 among the organic film 14.

The injection layer 17 is made of a transparent metallic film (such as, an Ag/Mg alloy or the like), and a transparent electrode film 18 is made of a transparent electrode film (such as ITO (indium-tin oxide), InZnO, AZO (Al—ZnO) or the like). The light emitted from the organic film 14 passes through the injection layer 17 and the transparent electrode film 18.

A protective film 25 is formed on a surface of the laminated film 19, and the protective film 25 is constituted by transparent films (a filling film 27, an inorganic film 28, a resin film 29, or the like), which will be discussed later. The light having passed through the transparent electrode film 18 enters the second panel 20 through the protective film 25.

The second panel 20 has a transparent substrate (second substrate 21) made of glass, plastic or the like. Assuming that a portion of the laminated films 19 where the pixel electrode 12 is positioned is taken as a luminescence portion 15, a color filter 23 of red, green or blue is provided on the surface of the second substrate 21 at a position opposed to the luminescence portion 15. A light entering the second panel 20 passes through the color filter 23, and is emitted outside after being converted to a colored light of red, green or blue.

In this way, although the display device 1 makes the organic film 14 generate and emit a light outside, organic materials to be used in the organic film 14 (a light-emitting material, a charge migration material, a charge transfer material or the like) are likely to be chemically denatured with moisture or oxygen. If such an organic material is denatured, the amount of the emitted light decreases, and no light is emitted in an extreme case.

In the display device 1 of the present invention, a protective film 25 is formed on a surface of the laminated film 19, and the protective film 25 includes a filling film 27, an inorganic film 28 and a resin film 29.

The thickness of the laminated film 19 varies depending upon the kinds and the film thicknesses of the thin films constituting the laminated film 19. The portions where the luminescence portions 15 are positioned are thinner than those where the transistors 40 or the like are positioned, so that concave parts 13 are formed. The filling film 27 is formed in order to fill the concave parts 13 at least on the respective luminescence portions 15.

For example, when the filling film 27 is formed on the luminescence portions 15 only, the concave parts 13 become shallower after they are filled with the filling film 27 than before they are filled with the filling film 27. When the filling film 27 is formed over the luminescence portion 15 and projections therearound, the height from the surface of the filling film 27 on the luminescence portion 15 to the surface of the filling film 27 on the projection is smaller than the height from the bottom of the concave part 13 to the surface of the projection. In any case, differences in level on the laminated film 19 are reduced.

The inorganic film 28 is formed on the surface of the laminated film 19 where the differences in level are reduced by filling the concave parts 13 with the filling film 27 so that at least the luminescence portions 15 are covered.

The inorganic film 28 is a diamond-like carbon thin film composed of diamond-like carbon as a major component or an AlN thin film composed of AlN as a major component. Note that "composed . . . as a major component" in the present invention means that the material as the major component is contained in 50% by weight or more.

Both the diamond-like carbon thin film and the AlN thin film not only have high transparency, but also higher gas tightness as compared to resin films or the like. Therefore, water or oxygen does not pass through the inorganic film 28 so that water or oxygen does not enter the luminescence portion 15 from the upper side.

In this embodiment, the inorganic film 28 is continuously formed to cover each of the luminescence portions 15, and the edge portion of the inorganic film 28 is adhered to the surface of the first panel 10 between the area where each luminescence portion 15 is arranged and inside of the inner periphery of the sealing member 22. Therefore, neither water nor oxygen enters the luminescence portion 15 from the sides.

In addition, because both diamond-like carbon and AlN have heat conductivity, the luminescence portion 15 does not reach a high temperature or undergo heat damage through heat being conducted to the inorganic film 28, even if the luminescence portion 15 generates the heat due to light emission.

If the inorganic film 28 is formed on a portion having a large difference in level, a crack is likely to be formed. As discussed above, because the inorganic film is formed after the concave parts 13 are filled with the filling film 27, each of the luminescence portions 15 is kept covered with the inorganic film 28.

In addition, when the concave part 13 is reduced or eliminated, the inorganic film 28 can be formed by a sputtering method without good coverage. Consequently, the dense inorganic film 28 can be formed by the sputtering method.

The resin film 29 fills an inner space surrounded by the sealing member 22 and the first and second panels 10, 20 without a gap, and adheres to the inner peripheral face of the sealing member 22, the surface of the second panel 20, the surface of the inorganic film 28, and that portion of the first panel 10 which is exposed from the inorganic film 28. Because no gap exists in the inner space, air hardly enters from the outside.

Here, the filling film 27 covers all the areas where each luminescence portion 15 is positioned (the light emitting area); the inorganic film 28 covers all the surface of the filling film 27; and the resin film 29 is formed to cover all the surface of the inorganic film 28. The edge of filling film 27 adheres to the first panel 10 outside the light emitting area, the edge of the inorganic film 28 adheres to the first panel 10 outside the filling film 27, and the edge of the resin film 29 adheres to the first panel 10 outside the inorganic film 28. Therefore, the surface and the peripheral face of the light emitting area is covered in three areas; namely, the filling film 27, the inorganic film 28 and the resin film 29 so that water and oxygen hardly invade.

Next, the producing apparatus of the present invention to be used for the production of the above-mentioned display device and the producing method of the present invention for the production of the display device 1 will be explained.

First Embodiment of the Producing Apparatus

Figure 2:
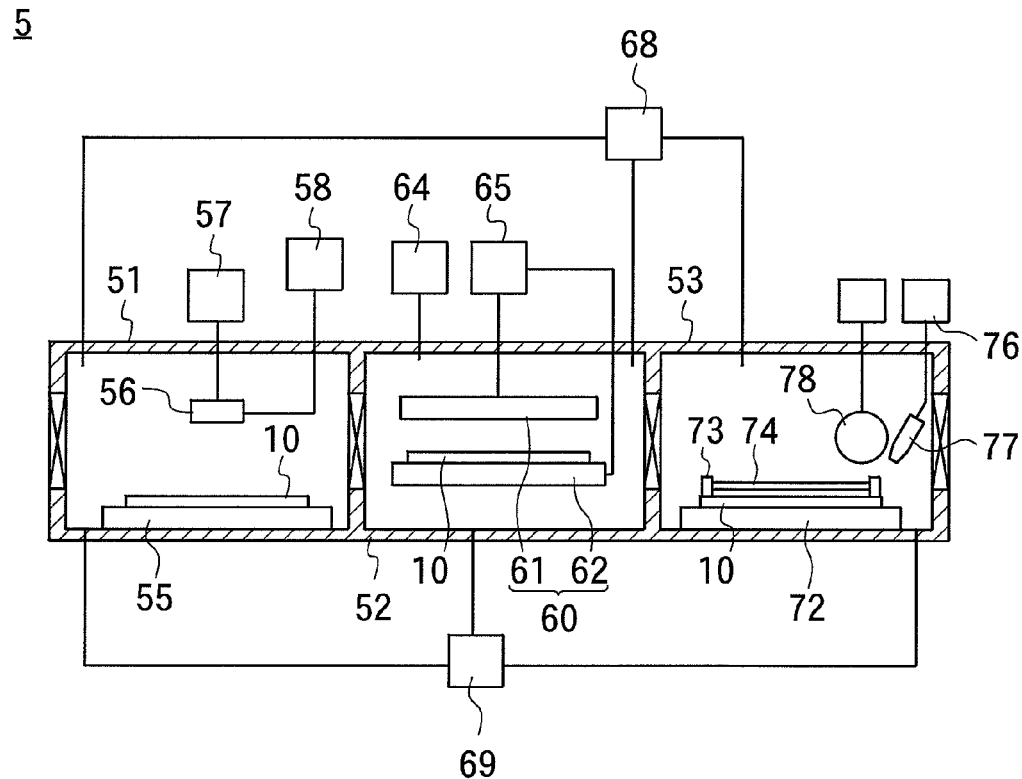
FIG. 2 is a sectional view for illustrating an embodiment of the producing apparatus of the present invention.

In FIG. 2, a reference numeral 5 denotes a first embodiment of the producing apparatus of the present invention. The producing apparatus 5 includes first to third film forming chambers 51 to 53.

An evacuation system 69 is connected to the first to third film forming chambers 51 to 53, respectively, and when the interiors of the first to third film forming chambers 51 to 53 are evacuated by the evacuating system 69, pressure-reduced ambience having pressures lower than the atmospheric pressure ($1.01325 \times 10^5$ Pa=760 Torr) are formed inside the first to third film forming chambers 51 to 53.

The first to third film forming chambers 51 to 53 are connected to one another directly or via other vacuum chambers (a buffer chamber, a transfer chamber or the like), and an object to be processed by this producing apparatus 5 is carried among the first to third film forming chambers 51 to 53 by a transfer unit (not shown) without being exposed to the atmosphere.

A printing table 55 on which the object to be processed is placed is arranged inside the first film forming chamber 51; and a printing head 56 is arranged at a position above the printing table 55 inside the first film forming chamber 51.

A transfer mechanism (not shown) is arranged inside the first film forming chamber 51, either one or both of the objects placed on the printing table 55 and the printing head 56 are to be moved by the transfer mechanism (not shown). Therefore, the printing head 56 and the object to be processed move relative to each other.

A filling agent feeding system 58 and a control system 57 are arranged outside the first film forming chamber 51. The filling agent feeding system 58 and the control system 57 are connected to the printing head 56, respectively, while the filling agent feeding system 58 feeds a liquid filling agent to the printing head 56; and the control system 57 is configured to detect a positional relationship between the printing head 56 and the object to be processed and causes the filling agent to be discharged through a nozzle when the nozzle of the printing head 56 is positioned above a desired position of the object to be processed (Ink jet method).

A heater (not shown) is provided inside the first film forming chamber 51; the filling agent impinged upon the object to be processed is heated by the heater; and a solvent in the filling agent is evaporated away in order to remove it.

An inorganic film forming unit 60 is arranged inside the second film forming chamber 52. In the first embodiment of the producing apparatus 5, the inorganic film forming unit 60 includes first and second electrodes 61 and 62, which are arranged inside the second film forming chamber 52.

In this embodiment, the first and second electrodes 61, 62 are flat electrodes, which are arranged horizontally inside the second film forming chamber 52 in a state such that the first and second electrodes 61, 62 are parallel to each other. The object to be processed is placed on the surface of the second electrode 62 opposed to the first electrode 61.

Meanwhile, the first and second electrodes 61, 62 may be inclined from the horizontal plane, respectively, so long as the object to be processed is held on the second electrode 62.

A power source 65 and a raw material gas feeding system 64 are arranged outside the second film forming chamber 52. The first and second electrodes 61, 62 are connected to the power source 65, respectively. When a high frequency voltage is applied between first and second electrodes 61, 62 in a state such that the second film forming chamber 52 is connected to a ground potential, while a raw material gas is being fed from the raw material gas feeding system 64, a plasma of the raw material gas is generated, and a polymer of the raw material gas is formed on the surface of the object to be processed.

Meanwhile, when one of the first and second electrodes 61, 62 is set at the ground potential, a high frequency voltage may be applied to set the other electrode at a negative or positive voltage relative to the ground potential. Alternatively, when one of the electrodes is set at a negative voltage relative to the ground potential, a high frequency voltage may be applied to set the other electrode at a positive voltage relative to the ground voltage. Further, the high frequency voltage may be applied to the other electrode in a state such that one of the electrodes is connected to the ground potential.

A mounting table 72 and a screen 74 are arranged inside the third film forming chamber 53, the object to be processed, which is carried inside the third film forming chamber 53, is then placed on the mounting table 72, and the screen 74 is arranged above the object by means of a spacer 73, while being spaced therebetween by a predetermined distance.

A nozzle 77 and a pressing means 78 are arranged above the screen 74, respectively. The nozzle 77 is connected to a resin liquid feeding system 76, and a resin liquid fed from the resin liquid feeding system 76 is discharged onto a surface of the screen 74 through the nozzle 77.

The pressing means 78 is a pressing roll or a squeegee, which can be horizontally and reciprocatively moved on the screen 74. A plurality of through-holes (not shown) are formed in the screen 74, and when the pressing means 78 is moved forward, the resin liquid is spread over the surface of the screen 74 and forced into the through-holes. When the pressing means is moved backward, the resin liquid is further forced into the through-holes, and the resin liquid is pushed out through the through-holes and dropped toward the object to be processed.

First Example of the Producing Method

Next, the steps of producing the display device of the present invention by using the first embodiment of the producing apparatus 5 will be explained.

First, the first and third film forming chambers 51, 53 are preliminarily vacuum evacuated. In this embodiment, the gas feeding system 68 is connected to the first to third film forming chambers 51 to 53. While the first and third film forming chambers 51, 53 are being continuously vacuum evacuated, an inert gas (for example, a dried $N_2$ gas) with the content of each of water and oxygen being 1 ppm or less, respectively, is fed into the first and third film forming chambers 51, 53 from the gas feeding system 68, so that pressure-reduced ambience having a pressure lower than the atmospheric pressure with the content of each of water and oxygen being 1 ppm or less (a printing ambience, a coating ambience) is formed therein, respectively (Pre-processing step).

Figure 3A:
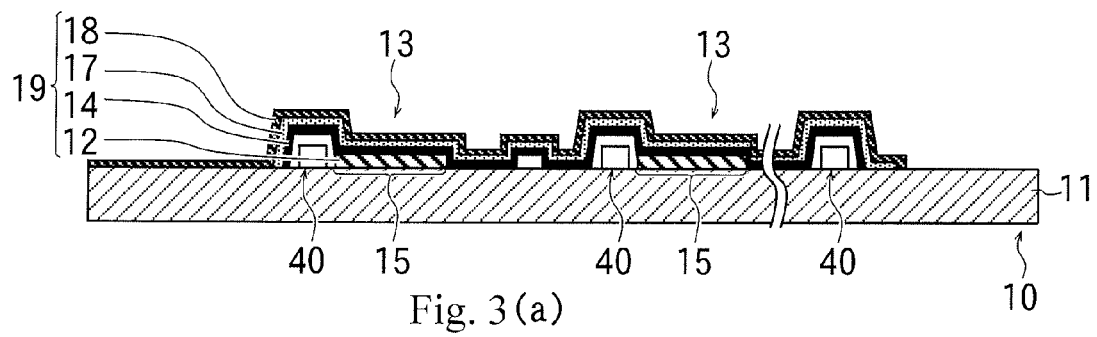
FIGS. 3($a$) to ($d$) are sectional views for illustrating steps of producing a display device of the present invention.

Next, a step of forming the filling film will be explained. FIG. 3(a) denotes the first panel 10 before the filling film 27 is formed, and each luminescence portion 15 is exposed in this state. While the printing ambience inside the first film forming chamber 51 is being maintained, the first panel 10 in the state shown in FIG. 3(a) is carried into the first film forming chamber 51 and placed on the printing table 55.

A filling agent of which a transparent resin is dissolved in a solvent is preliminarily filled in the filling agent feeding system 58.

Positional information of the luminescence portions 15 is preliminarily inputted in the control system 57, and while the printing ambience is being maintained, the first panel 10 and the printing head 56 are relatively moved by the control system 57. After the concave parts 13 are filled with the filling agent by impinging the filling agent upon each of the luminescence portions 15 according to the positional information in the control system 57, the filling film 27 filling the concave parts 13 is formed by drying the filing agent with the heater.

In this case, the positional information may be inputted directly into the control system 57, or the positional information may be inputted into the control system 57 by connecting another device in which the positional information is already memorized.

Figure 3B:
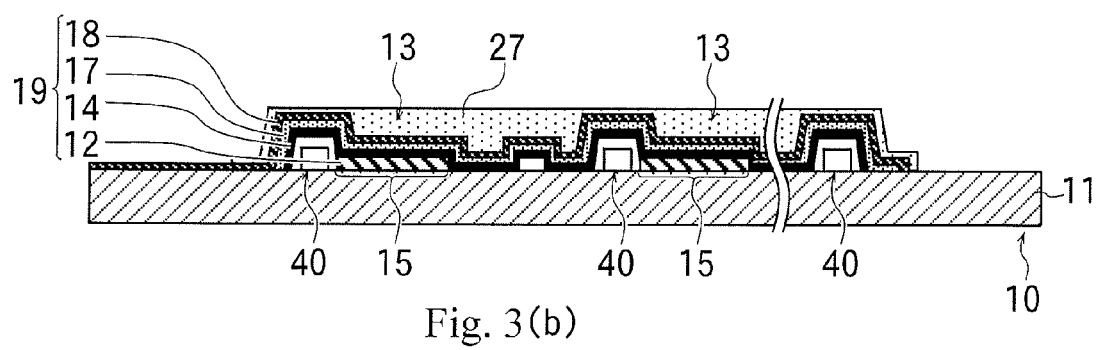

In the filling film forming step, the resin liquid (the filling agent) may be so impinged as to not overflow from the concave parts 13, while projections around the concave parts 13 are exposed from the filling film 27. Furthermore, in the filling film forming step, as shown in FIG. 3(b), it may be that the resin liquid is so impinged as to overflow from the concave parts 13 and cover the projections around the concave parts 13 with the filling film 27 and the area, where each luminescence portion 15 is positioned, is covered with a single continuous filling film 27.

Next, a step of forming the inorganic film will be explained.

In this embodiment, the raw material gas feeding system 64 includes a raw material gas tank in which at least one kind of raw material gases selected from a hydrocarbon group consisting of $CH_4$, $C_6H_6$ and $C_2H_2$ is charged; and a diluent gas tank in which an inert gas (such as, an Ar gas or the like) is charged.

The interior of the second film forming chamber 52 is vacuum evacuated, and once set at a high vacuum. Then, after a byproduct or the like produced when the previous panel is produced is evacuated, the inert gas is introduced from the gas feeding system 68, and the raw material gas and the diluent gas are introduced from the raw material feeding system 64, so that a reactive ambience having a pressure lower than the atmospheric pressure with the content of each of water and oxygen being 1 ppm or less is preliminarily formed.

While the reactive ambience is being maintained, the first panel 10 on which the filling film 27 is formed is carried into the inside of the second film forming chamber 52 and placed on the surface of the second electrode 62.

A mask (not shown) is arranged on the first panel 10 such that an edge portion of the first panel 10 is covered with the mask, while at least the areas where the luminescence portions 15 are arranged are exposed through the inside of the through-holes. When a high frequency voltage is applied between the first and second electrodes 61, 62, the inorganic film 28 made of a polymer of the hydrocarbon (diamond-like carbon) grows on the surface of the resin film 27 on each luminescence portion 15 (FIG. 3(c)).

In the inorganic film forming step of the first example of the producing method and a second example of the producing method as discussed later, the entire filling film 27 and the surround portion of the filling film 27 are exposed to the interior of the through-holes formed on the mask; and the inorganic film 28 is formed to cover the entire surface of the filling film 27 and the surrounding portion of the filling film 27 of the surface of the first panel 10 surrounding the filling film 27.

As discussed above, the concave parts 13 where the luminescence portion 15 is positioned are filled with the filling film 27 so that differences in level between the surrounding projections are reduced. Thus, the inorganic film 28 grown on the luminescence portions 15 is not separated from the inorganic film 28 grown on the region surrounding the luminescence portions 15; and each luminescence portion 15 is covered with the single continuous inorganic film 28. When the thickness of the inorganic film 28 reaches a predetermined film thickness, the application of the voltage between the first and second electrodes 61, 62 is stopped.

Next, a step of forming a resin film will be explained.

As discussed above, the coating ambience having a pressure lower than the atmospheric pressure is preliminarily formed inside the third film forming chamber 53. While the coating ambience is being maintained, the first panel 10 on which the inorganic film 28 is formed is carried into the third film forming chamber 53 and placed horizontally on the mounting table 72. The screen 74 is horizontally placed above the surface of the first panel 10.

When the pressing means 78 is moved forward while the coating ambience is being maintained, the resin liquid is defoamed as it spreads on the screen 74 and air remaining in the resin liquid is removed because the pressure of the coating ambience is lower than the atmospheric pressure.

Therefore, the resin liquid from which air is removed enters the through-holes of the screen 74; and when the pressing means 78 is moved backward, that resin liquid drops onto the surface of the first panel 10 through the through-holes.

The screen 74 is made of a material having a low flexibility (such as, a metallic plate or the like), and its thickness is set so that it may not be bent even by pressing with the pressing means 78.

Thus, the height of the screen 74 from the surface of the first substrate 11 is maintained at a predetermined height.

Since the resin liquid dropping through the through-holes of the screen 74 fills a gap between the first panel 10 and the screen 74, even if a difference in level exists at the surface of the panel 10, that difference in level is buried with the resin liquid so that a coated layer having a uniform height from the first substrate 11 to the surface of coated layer is formed.

Figure 3C:
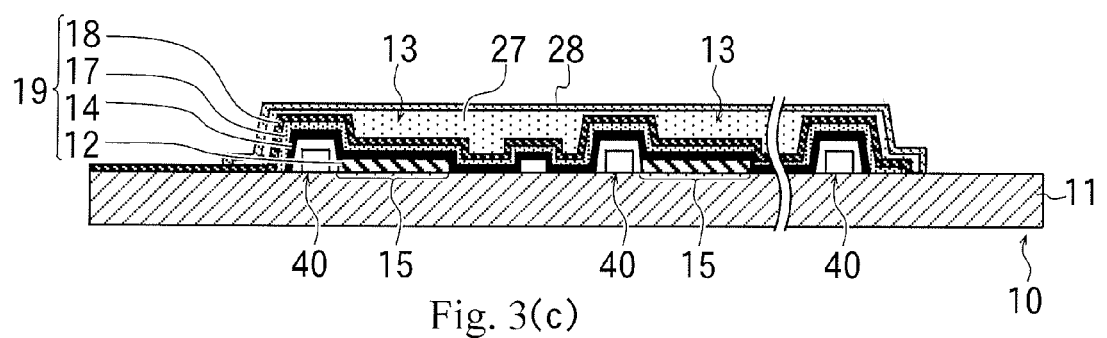
Figure 3D:
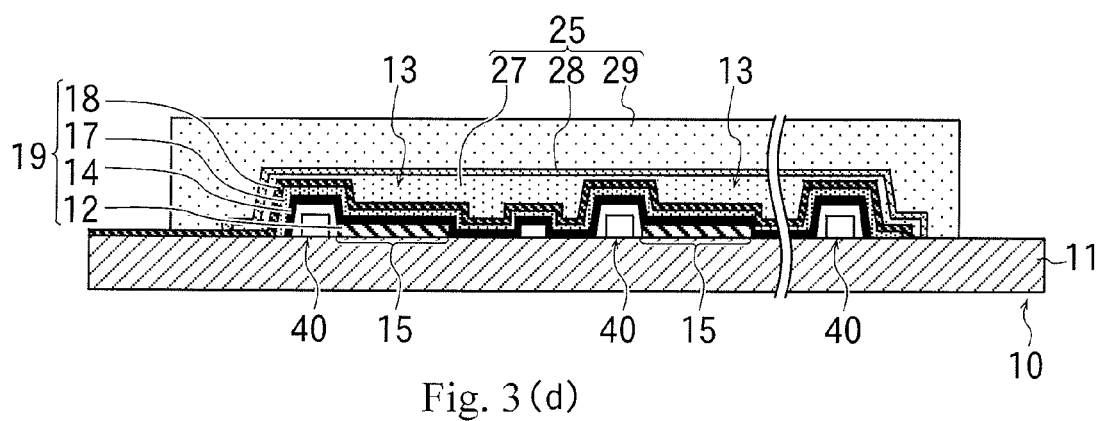

In this embodiment, the resin liquid includes a photo-polymerizable resin (such as an acrylate or the like); and when the coated layer is irradiated with ultraviolet rays, the coated layer is cured through the polymerization of the photo-polymerizable resin so that the resin film 29 having a uniform thickness from the first substrate 11 to the surface of the coated layer is formed (FIG. 3(d)).

As discussed above, while the object to be processed (the first panel) is carried among the first to third film forming chambers 51 to 53, the first panel 10 is not exposed to the atmosphere, and in addition, each of the printing ambience, the reactive ambience and the coating ambience includes 1 ppm or less of each of oxygen and water. Accordingly, neither oxygen nor water is mixed into the protective film 25 composed of the filling film 27, the inorganic film 28, and the resin film 29.

Next, a sealing step will be explained.

The first panel 10 of which the protective film 25 is formed is taken out from the third film forming chamber 53, and carried out to the outside of the producing apparatus 5.

The ring-shaped sealing member is arranged along the outer periphery of the resin film 41 on the surface of the first panel 10 in which the resin film 29 is formed in order to form the sealing member so as to be in close contact with the peripheral face of the resin film 29.

While the height of the ring of the sealing member is set at the same as or greater than the height from the surface of the first substrate 11 to the surface of the resin film 29, the second panel 20 is placed on the first panel 10. After alignment is performed to make the color filter 23 to be opposed to a predetermined luminescence portion 15, the second panel 20 is lowered and is in contact with the sealing member.

The sealing member is made of an adhesive material (such as glass, a resin or the like) so that when the sealing member is heated while the second panel 20 is being pressed, the sealing member is softened and adhered to both the first and second panels 10, 20. Further, when the pressing is continued under heating, the softened sealing member is crushed by pressing; the second panel 20 is adhered to the resin film 29; and a space surrounded by the first and second panels 10, 20 and the sealing member is filled with the resin film 29 without a gap. Next, when the sealing member is solidified by cooling, the first and second panels 10, 20 are bonded together by the sealing member, thereby obtaining a display device 1 as shown in FIG. 1.

In the first example of the producing method and the below-mentioned second example of the producing method, the pressure of the printing ambience is not particularly limited, so long as the pressure is the same as the atmospheric pressure or less. When the resin liquid is coated by the ink jet method, for example, a reduced ambience of around 400 Torr ($533.3 \times 10^2$ Pa when converted to Pa) is preferable. It is noted that when both a Torr value and a converted Pa value thereof are described together, preference is given to the Torr value over the Pa value.

The method of forming the inorganic film 28 is not particularly limited. However, because the ink jet method cannot be performed under high vacuum (for example, 200 Torr or more), a difference in pressure between the first and second film forming chambers 51, 52 becomes too large in a film forming method, such as, a sputtering method requiring high vacuum (for example, $5 \times 10^{-3}$ Torr). Thus, dust is generated when the object to be processed is carried from the first film forming chamber 51 directly to the second film forming chamber 52; and consequently, contamination of the dust into the protective film 25 occurs. Such a problem is avoided if a pressure adjusting buffer chamber is provided between the first and second film forming chambers 51, 52, but the structure of the producing apparatus 5 becomes complicated.

As discussed above, in the first example of the producing method, the raw material gas is converted to plasma to form the inorganic film. In this inorganic film forming method, because the film can be formed at, for example, 400 Torr ($533.3 \times 10^2$ Pa when converted to Pa), the pressure difference between the first and second film forming chambers 51, 52 becomes smaller as compared to the sputtering method. Therefore, no dust is generated even if the first and second film forming chambers 51, 52 are directly connected without the use of the buffer chamber.

The pressure of the coating ambience is not particularly limited, so long as the pressure is the same as the atmospheric pressure or less. However, in order to effectively defoam the resin liquid, the pressure is in the range of 250 Torr or more and 760 Torr or less; i.e., in the range of $333.3 \times 10^2$ Pa or more and $1013.2 \times 10^2$ Pa or less when converted to Pa.

By an inorganic film forming method in which the raw material gas is converted to plasma, the pressure difference between the second and third film forming chambers 52, 53 is decreased so that no dust is mixed into the protective film 25 even if the second and third film forming chambers 52, 53 are directly connected.

Next, a second embodiment of the producing apparatus and a second example of the producing method of the present invention will be explained.

Second Embodiment of the Producing Apparatus

Figure 4:
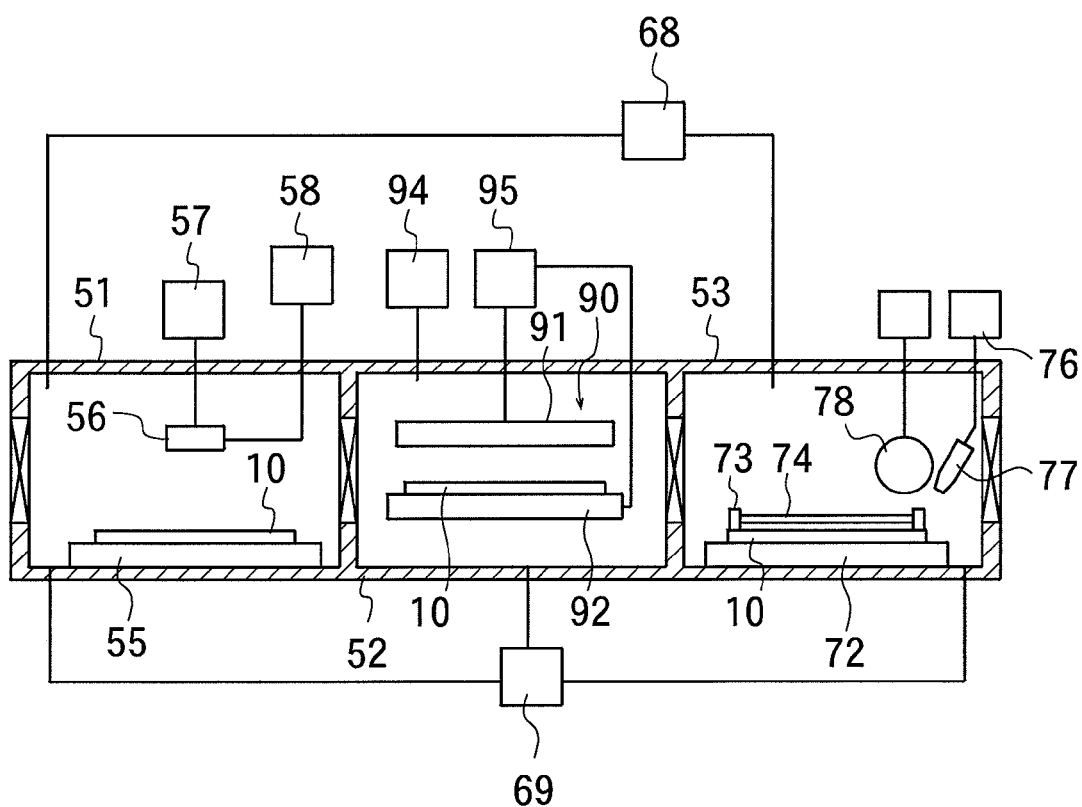
FIG. 4 is a sectional view for illustrating a second embodiment of the producing apparatus of the present invention.

In FIG. 4, a reference numeral 6 denotes a producing apparatus of a second embodiment. The producing apparatus 6 of the second embodiment has the same construction as in the producing apparatus 5 of the first embodiment, except that an inorganic film forming unit 90 and a gas feeding system 94 connected to the second film forming chamber 52 are different. The same reference numerals are provided for the same parts as those in the producing apparatus 5 of the first embodiment, and a corresponding explanation is omitted.

The inorganic film forming unit 90 of the producing apparatus 6 of the second embodiment has a target 91; and the target 91 is arranged inside the second film forming chamber 52.

A power source 95 and a gas feeding system 94 are arranged outside the second film forming chamber 52; and the target 91 is connected to the power source 95. In the producing apparatus 6 of the second embodiment, the gas feeding system 94 is a sputtering gas feeding system in which a sputtering gas is disposed.

The interior of the second film forming chamber 52 is vacuum evacuated by an evacuating system 69, and while the sputtering gas is being fed from the sputtering gas feeding system 94 to the second film forming chamber 52, the target 91 is sputtered by applying a voltage to the target 91 from the power source 95 in a state such that second film forming chamber 52 is set at a ground potential.

In the producing apparatus 6 of the second embodiment, the second film forming chamber 52 is connected to each of the first and third film forming chambers 51, 53 via a vacuum chamber (not shown), for example, buffer chamber.

Even if the pressure difference between the second film forming chamber 52, and the first and third film forming chambers 51, 53 is large, no dust is generated because the inner ambience of the second film forming chamber 52 is not directly connected to the first or third film forming chamber 51, 53.

Next, a second example of the producing method by using the producing apparatus 6 of the second example as described above will be explained.

A Producing Method of a Second Example

A producing method of a second example of the invention is the same as the producing method of the first example of the invention in terms of the pre-processing process and the filling film forming step. In the above-discussed steps, a filling film 27 is formed on a surface of a first panel 10.

Next, an inorganic film forming step of the producing method of the second example will be explained.

In this example, the sputtering gas feeding system 94 includes a sputtering gas tank in which a sputtering gas such as Ar gas or Ne gas is disposed and a reactive gas tank in which a reactive gas (here, nitriding gas made of $N_2$) is disposed.

A vacuum ambience is formed by vacuum evacuating the interior of the second film forming chamber 52 by means of the evacuating system 69; and while this vacuum ambience is being maintained, the first panel 10 formed with the filling film 27 is carried into the second film forming chamber 52.

In this method, the substrate holder 92 is arranged inside the second film forming chamber 52, the first panel 10 carried into the second film forming chamber 52 is placed on the substrate holder 92, and that face of the first panel 10 on which the filling film 27 is formed is opposed to the target 91.

While the interior of the second film forming chamber 52 is continuously vacuum evacuated, the sputtering gas and the reactive gas are fed from the sputtering gas feeding system 94, thereby forming a sputtering ambience having a pressure lower than the pressure of the printing ambience. For example, the pressure of the printing ambience is 400 Torr ($533.3 \times 10^2$ Pa when converted to Pa); and the pressure of the sputtering ambience is $5 \times 10^{-3}$ Torr ($6.67 \times 10^{-1}$ Pa when converted to Pa). It is noted that when the Torr value and the converted Pa value are given together in the specification of this application, preference is given to the Torr value over the Pa value.

A mask (not shown) is arranged on the first panel 10 to cover an edge portion of the first panel 10 therewith; and the target 91 is sputtered in a state such that at least an area in which the luminescence portions 15 are disposed is exposed inside the through-hole of the mask while the sputtering ambience is being maintained.

The target 91 is an Al target composed mainly of Al, and the reactive gas is a nitriding gas containing a nitrogen atom in a chemical structure (for example, $N_2$) so that an inorganic film 28 composed of aluminum nitride (AlN) grows on a surface of the filling film 27 on each luminescence portion 15 (FIG. 3(c)).

In this example, the sputtering is performed in a state such that the entire filling film 27 and the surrounding of the filling film 27 are exposed to the interior of the through-hole of the mask, thereby an inorganic film 28 is formed to cover the entire surface of the filling film 27 and the surrounding portion of the filling film 27 on the surface of the first panel 10.

In the sputtering, if a difference in level exists on the object to be formed with the film, the formed film is more likely to be divided as compared with other film forming method (such as, CVD, vapor deposition or the like).

As discussed above, the concave parts 13 where the luminescence portions 15 are positioned are filled with the filling film 27, and the difference in level between the concave parts 13 and the surrounding projections are reduced. Thus, the inorganic film 28 grown on the luminescence portions 15 and the inorganic film 28 grown on the region surrounding the luminescence portion are not divided, and each luminescence portion 15 is covered with a single continuous inorganic film 28. When the thickness of the inorganic film 28 reaches a predetermined film thickness, the application of the voltage to the target 91 is stopped.

Next, a resin film is formed by performing a resin film forming step under the same condition as in the above first example of the producing method.

Meanwhile, since the sputtering ambience is a high vacuum, and if the coating ambience in forming the resin film is set at a high vacuum equivalent to the sputtering ambience, it becomes difficult to control the pressure inside the resin liquid feeding system 76. Therefore, the coating ambience is set at a pressure, which is higher than the pressure of the sputtering ambience and lower than the atmospheric pressure.

After the formation of the resin film, when the first and second panels are sealed by the same method as in the sealing step of the first example of the producing method, the display device 1 is obtained.

As mentioned above, in the second example of the producing method, the sputtering ambience is set at high vacuum of around $5 \times 10^{-3}$ Torr. To the contrary, the pressure of the printing ambience is in the range of 200 Torr or more and the atmospheric pressure (for example, around 400 Torr) or less, and the pressure of the coating ambience is 250 Torr or more and 760 Torr or less ($333.3 \times 10^2$ Pa or more and $1013.2 \times 10^2$ Pa or less when converted to Pa).

In other words, the inner pressure of the second film forming chamber 52 is far lower than the inner pressures of the first and third film forming chambers 51, 53, so that when the second film forming chamber 52 is connected directly to the first and third film forming chambers 51, 53, dust may be generated due to the pressure difference.

The dust generation will be suppressed, if the pressure difference is lowered by increasing the inner pressure of the second film forming chamber 52 or by decreasing the inner pressures of the first and third film forming chambers 51, 53 before the second film forming chamber 52 is connected to the first and third film forming chambers 51, 53. However, it takes a long time to adjust the pressures, which makes a time period required for the production longer.

In order to suppress the generation of the dust and to shorten the production time period, other vacuum chambers (buffer chambers) are disposed between the first and second film forming chambers 51, 52 and between the second and third film forming chambers 52, 53, respectively.

When the object to be processed (first panel) is carried from the first film forming chamber 51 to the second film forming chamber 52, an inner ambience having a pressure almost equal to the pressure of the first film forming chamber 51 is formed in the buffer chamber between the first and second film forming chambers 51, 52 in a state such that the buffer chamber between the first and second film forming chambers 51, 52 is blocked from the second film forming chamber 52 and the first panel 10 is carried from the first film forming chamber 51 to the buffer chamber.

After the first film forming chamber 51 is blocked from the buffer chamber, the buffer chamber is vacuum evacuated, and thereby its inner pressure is reduced to almost the same pressure as the inner pressure of the second film forming chamber 52. Then, the buffer chamber is connected to the second film forming chamber 52, and the first panel 10 is carried from the buffer chamber into the second film forming chamber 52.

When the first panel 10 is to be carried from the second film forming chamber 52 into the third film forming chamber 53, an inner ambience, which has almost the same pressure as the inner pressure of the second film forming chamber 52, is formed inside the buffer chamber between the second and third film forming chambers 52, 53, in a state such that the buffer chamber is blocked from the third film forming chamber 53, and the first panel 10 is carried from the second film forming chamber 52 into the buffer chamber.

The second film forming chamber 52 is blocked from the buffer chamber, the pressure inside the buffer chamber being raised by the introduction or the like of a dried inert gas (the content of each of oxygen and water being 1 ppm or less) or the like, so that the pressure is set at a level almost equal to the inner pressure of the third film forming chamber 53. Then, the buffer chamber is connected to the third film forming chamber 53, and the first panel 10 is carried from the buffer chamber into the third film forming chamber 53.

In this way, when the carriage between the first and second film forming chamber 51, 52 and the carriage between the second and third film forming chamber 52, 53 are performed through the buffer chambers, the generation of the dust is suppressed in order to prevent the contamination of the first panel 10.

Meanwhile, in the second example of the producing method, the method for producing the inorganic film 28 is not particularly limited, and, a sputtering method is preferable when a thin film of aluminum nitride is formed as the inorganic film 28. Further, the inorganic film 28 can be formed by sputtering an AlN target without a reactive gas being fed into the sputtering ambience.

In addition, the constituting material of the inorganic film 28 is not limited to AlN in the second example of the producing method. By sputtering a target 91 containing at least any one kind of inorganic materials selected from the group consisting of Al, AlN, metal compounds (including oxides and nitrides) other than AlN and metals, an inorganic film 28 containing at least any one kind of the inorganic materials selected from the group consisting of Al, AlN, the metal compounds other than AlN and the metal can be formed.

The reactive gas in forming the film of AlN is not limited to $N_2$ and nitriding gases, which contains nitrogen in the chemical structure, can be widely used. As the nitriding gas other than $N_2$, ammonia is recited, for example.

OTHER EXAMPLES

In the first and second examples of the producing method, the filling agent coating method for forming the filling film 27 is not particularly limited. However, an ink jet method is the most preferable so as to accurately coat the filling agent on each of the luminescence portions 15. In coating the filling agent by the ink jet method, if the viscosity of the resin liquid is too high, nozzle clogging will occur so that its viscosity is preferably 10 cP (centipoises) or less.

In the first and second examples of the producing method, the resin to be incorporated into the filling agent is not particularly limited, and various resins (such as, a thermoplastic resin, a thermosetting resin, a photopolymerizable resin, etc.) can be used. In a case such that the thermosetting resin is incorporated into the filling agent, when the impinged filling agent is heated so that the thermosetting resin may be polymerized, the filling film 27 including the polymer of the thermosetting resin is formed. In a case such that the filling agent includes the photopolymerizable resin, after the filling agent is impinged and the solvent is evaporated off, the filling film 27 containing the polymer of the photopolymerizable resin can be obtained by irradiating light.

In the first and second examples of the producing method, a filling agent containing an inorganic material can be used. If a water capturing agent having water capturability is used as an inorganic material, not only does the filling film 27 reduce the difference in level but also captures moisture entering the display device 1 so that the organic film 14 becomes less damaged. As the water capturing agent, a metallic complex of aluminum, for example, is as shown below by the following formula (1):

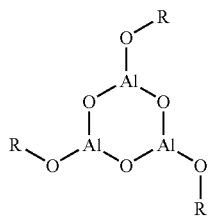

Chemical formula (1)

This metallic complex of aluminum chemically adsorbs water, opens a 6-membered ring, and captures water through the formation of $3(R-O-Al(OH)_2)$. This metallic complex of aluminum is not only excellent in water capturability, but also provides excellent transparency when the film is formed. Thus, it is particularly suitable for the display device 1 of the top emission type.

As the filling agent containing the above described water capturing agent, the agent with the trade name "OleDry" manufactured by Futaba Corporation in which the above metallic complex of aluminum is dissolved in a hydrocarbon-based organic solvent can be used.

Further, when a filling agent containing both the above-mentioned resin and the water capturing agent of the inorganic material is used in the first and second examples of the producing method, a filling film 27 containing both the above-mentioned resin and the water capturing agent can be formed.

In the first and second examples of the producing method, the coating method of the resin liquid in the resin film forming step is not particularly limited, and a screen printing method using the above-mentioned screen is more preferable than an ink jet method in order to coat such a large amount of the resin liquid for filling the gap between the first and second panels 10, 20. The viscosity (e.g., 100,000 cp) of the resin liquid suitable for the screen printing method is higher than in the ink jet method.

In the first and second examples of the producing method, the resin to be included into the resin liquid is not particularly limited; however, the thermoplastic resin and the thermosetting resin can be used as in the case of the filling agent. When the resin liquid contains the thermosetting resin, the resin film 29 containing the polymer of the thermosetting resin is formed by heating the coated layer so as to polymerize the thermosetting resin.

In the first and second examples of the producing method, the step of solidifying the coated layer may be performed until the sealing member 22 is disposed after the resin liquid is coated, or it may be simultaneously performed when bonding the first and second panels 10, 20 together by the sealing member 22. The step of solidifying the coated layer may be performed after the first and second panels 10, 20 are bonded together with the sealing member 22. However, when the solidification is performed after they are bonded together by the sealing member 22, the solvent evaporated from the coated layer is sealed between the first and second panels 10, 20 so that the organic film 14 is damaged by the solvent. Therefore, it is preferable to perform the step of solidifying the coated film before the first and second panels 10, 20 are bonded together.

As described above, explanation has been provided for the top-emission type display device, which emits the light discharged toward the second panel 20 side from the organic film 14. However, the present invention is not limited thereto. The display device of the present invention may be a bottom type display device in which a first substrate 11 is made of a transparent substrate (such as, a glass substrate, a plastic substrate or the like); pixel electrodes 12 are made of a transparent electrode of ITO, AZO or the like; and the light discharged toward the first substrate 11 side from an organic film 14 is emitted outside through the pixel electrodes 12 and the first substrate 11. In the case of the bottom-emission type display device, the filling film 27, the inorganic film 28 and the resin film 29 may be made of opaque materials.

In this case, the color filters may be provided at the first substrate 11. Meanwhile, light colored with the organic film may be emitted by adding a coloring agent in the organic film in each of the luminescence portions 15 without the color filters.

What is claimed is:

1. A display device producing method for producing a display device, the display device having a first and a second panels, a protective film, the first and second panels having surfaces arranged opposite to each other, a laminated film having concave parts and arranged on the surface of the first panel, and luminescence portion of which a lower electrode, an organic film and an upper are electrode laminated, and the luminescence portion is positioned where the concave part is arranged, wherein the protective film has a filling film, an inorganic film and a resin film, and the protective film is formed on a surface of the laminated film, the display device producing method comprising the steps of:

a filling film forming step for: carrying the first panel on which the laminated film is formed into the first film forming chamber, and forming a filling film by impinging a filling agent in the concave part in order to make a face of the first panel on which the concave parts are formed to be flatter than before the filling film is formed in the state that a printing ambience which is at a pressure lower than the atmospheric pressure is formed inside the first film forming chamber;

an inorganic film forming step for: carrying the first panel of which the filling film is formed into the second film forming chamber, and forming an inorganic film on the surface of the filling film in the state that a film forming ambience which is at a pressure lower than the atmospheric pressure is formed inside the second film forming chamber, a resin film forming step for: carrying the first panel on which the inorganic film is formed inside a third film forming chamber and forming a resin film on a surface of the inorganic film by screen printing method in the state that a coating ambience having a pressure lower than atmospheric pressure is formed inside the third film forming chamber.

2. The display device producing method according to claim 1, the inorganic film forming step further comprising:
carrying the first panel on which the filling layer is formed into the second film forming chamber;
arranging the first panel between first and second electrodes inside the second film forming chamber;
applying a voltage between the first and second electrodes in the state that a reactive ambience containing a hydrocarbon gas and having a pressure lower than the atmospheric pressure and equal to or higher than the printing ambienve is formed inside the second film forming chamber; and
forming the inorganic film including diamond-like carbon on a surface of the filling film.

3. The display device producing method according to claim 2 further comprising;
after the resin film forming step, making a surface of the second panel opposed to a face of the first panel on which the resin film is formed; and
bonding the second panel to the first panel by means of a ring-shaped sealing member surrounding the resin film in the state that the second panel is adhered to the resin film.

4. The display device producing method according to claim 1, the inorganic film forming step further comprising:
carrying the first panel on which the filling film is formed into the second film forming chamber; and
forming the inorganic film on a surface of the filling film by sputtering a target arranged inside the second film forming chamber in the state that a sputtering ambience containing a sputtering gas and having a pressure lower than the pressure of the printing ambience is formed inside the second film forming chamber.

5. The display device producing method according to claim 4,
wherein the target containing Al is used, and a gas containing nitrogen in its chemical structure is incorporated into the sputtering ambience and the sputtering is performed, thereby the inorganic film containing AlN is formed.

6. The display device producing method according to claim 1,
wherein the filling film is formed in the state that the content of each of oxygen and water inside the first film forming chamber is set to 1 ppm or less, and
wherein the inorganic film is formed in the state that the content of each of oxygen and water inside the second film forming chamber is set to 1 ppm or less.

* * * * *